(12) United States Patent
Park et al.

(10) Patent No.: US 8,089,316 B2
(45) Date of Patent: Jan. 3, 2012

(54) WIDEBAND ACTIVE CIRCUIT WITH FEEDBACK STRUCTURE

(75) Inventors: Chul Gyun Park, Gyunggi-do (KR); Jae Sung Rieh, Seoul (KR); Dong Hyun Kim, Seoul (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 0 days.

(21) Appl. No.: 12/646,268

(22) Filed: Dec. 23, 2009

(65) Prior Publication Data

US 2011/0084766 A1    Apr. 14, 2011

(30) Foreign Application Priority Data

Oct. 8, 2009    (KR) .......................... 10-2009-0095571

(51) Int. Cl.
*H03F 3/45*    (2006.01)

(52) U.S. Cl. ....................................... 330/258; 330/291

(58) Field of Classification Search .......... 330/252–261, 330/291, 85
See application file for complete search history.

(56) References Cited

U.S. PATENT DOCUMENTS 6,624,698 B2 *   9/2003   Nagaraj ........................ 330/258

FOREIGN PATENT DOCUMENTS

KR    1020090047619 A    5/2009
* cited by examiner

*Primary Examiner* — Hieu Nguyen
(74) *Attorney, Agent, or Firm* — Lowe, Hauptman, Ham & Berner, LLP (57) ABSTRACT

A broadband active circuit with a feedback structure includes: an active load unit providing a load varied according to a control voltage; an active circuit unit connected between the active load unit and a ground and outputting a signal corresponding to a pre-set bandwidth, among input signals; and a feedback circuit unit formed between an output terminal of the active circuit unit and the active load unit and providing a signal from the output terminal of the active circuit unit to the active load unit.

21 Claims, 5 Drawing Sheets

WIDEBAND ACTIVE CIRCUIT WITH FEEDBACK STRUCTURE

CROSS-REFERENCE TO RELATED APPLICATIONS

This application claims the priority of Korean Patent Application No. 10-2009-095571 filed on Oct. 8, 2009, in the Korean Intellectual Property Office, the disclosure of which is incorporated herein by reference.

BACKGROUND OF THE INVENTION

1. Field of the Invention

The present invention relates to a wideband active circuit with a feedback structure applicable to an amplifier, a mixer, or the like, and more particularly, to a wideband active circuit with a feedback structure for feeding back a signal of an output terminal to an active load to thereby improve bandwidth.

2. Description of the Related Art

In general, as expected requirements for a data transfer rate are increasing in a broadcasting or communications system, the bandwidth of both a digital and an analog circuit needs to be sufficiently assured.

In addition, in the case of an amplifier configured as a short channel device, if a gate length of a transistor increases, the gain is thereby increased, but an RC time constant value also increases, thus reducing bandwidth. Thus, it is of critical importance to obtain a high gain and a wide bandwidth while consuming less power.

For an amplifying circuit corresponding to the related art active circuit, there are several methods for increasing bandwidth, and among them, a feedback technique and a Miller capacitance cancellation using a cascade transistor are commonly used.

Among the feedback methods for improving the bandwidth of the related art active circuit, a resistive feedback reduces the gain, while a capacitive feedback has a limitation in increasing bandwidth, although it can increase the bandwidth without a gain reduction.

Meanwhile, in case of Miller capacitance cancellation using a cascade transistor which has high output resistance, it is difficult to obtain much gain in terms of bandwidth unless an input pole is dominant.

SUMMARY OF THE INVENTION

An aspect of the present invention provides a broadband active circuit with a feedback structure for feeding back a signal of an output terminal to an active load to thereby improve a bandwidth.

According to an aspect of the present invention, there is provided a broadband active circuit with a feedback structure, including: an active load unit providing a load varied according to a control voltage; an active circuit unit connected between the active load unit and a ground and outputting a signal corresponding to a pre-set bandwidth, among input signals; and a feedback circuit unit formed between an output terminal of the active circuit unit and the active load unit and providing a signal from the output terminal of the active circuit unit to the active load unit.

The active load unit may have a cascade structure between a power voltage terminal and an output terminal and provide a load varied according to the control voltage.

The active load unit may have a cascade structure between a ground terminal and an output terminal and provide a load varied according to the control voltage, and may further include a current source connected between the power voltage terminal and the output terminal.

The active load unit may include at least one MOS transistor, and the feedback circuit unit may include an input terminal connected to the output terminal of the active load unit and an output terminal connected to a gate of the MOS transistor of the active load unit.

The active load unit may include at least one MOS transistor, and the feedback circuit unit may include an input terminal connected to the output terminal of the active load unit and an output terminal connected to a source of the MOS transistor of the active load unit.

The feedback circuit unit may be one selected from among an amplifier, a high pass filter (HPF), and a serial resonance circuit.

According to another aspect of the present invention, there is provided a broadband active circuit with a feedback structure, including: an active load unit connected to a power voltage terminal and providing a load varied according to a control voltage; an active circuit unit connected between the active load unit and a ground and outputting a signal corresponding to a pre-set bandwidth, among input signals; and a feedback circuit unit configured as an amplifier formed between an output terminal of the active circuit unit and the active load unit and amplifying a signal from the output terminal of the active circuit unit to provide the control voltage to the active load unit.

The active load unit may have a cascade structure between a power voltage terminal and an output terminal and provide a load varied according to the control voltage.

The active load unit may have a cascade structure between a ground terminal and an output terminal and provide a load varied according to the control voltage, and may further include a current source connected between the power voltage terminal and the output terminal.

The active load unit may include at least one MOS transistor, and the feedback circuit unit may include an input terminal connected to the output terminal of the active load unit and an output terminal connected to a gate of the MOS transistor of the active load unit.

The active load unit may include at least one MOS transistor, and the feedback circuit unit may include an input terminal connected to the output terminal of the active load unit and an output terminal connected to a source of the MOS transistor of the active load unit.

The active circuit unit may be an amplifier connected between the active load unit and a ground and amplifying a signal corresponding to a pre-set bandwidth, among input signals, by a pre-set gain.

The active load unit may include: a first PMOS transistor having a source connected to the power voltage terminal, a gate receiving a first control voltage among the control voltages, and a drain connected to a first output terminal among the output terminals; and a second PMOS transistor having a source connected to the power voltage terminal, a gate receiving a second control voltage among the control voltages, and a drain connected to a second output terminal among the output terminals.

The active circuit unit may include: a first NMOS transistor having a drain connected to a first output terminal, a source, and a gate connected to a first input terminal; a second NMOS transistor having a drain connected to a second output terminal, a source, and a gate connected to a second input terminal; and a third NMOS transistor having a drain connected to a connection node between the sources of the first and second NMOS transistors, a gate connected to a first bias voltage terminal, and a source connected to a ground.

The feedback circuit unit may include: a first inductor having one end connected to the power voltage terminal; a second inductor having one end connected to the power voltage terminal; a fourth NMOS transistor having a drain connected to the other end of the first inductor, a source, and a gate connected to the first output terminal; a fifth NMOS transistor having a drain connected to the other end of the second inductor, a source, and a gate connected to the second output terminal; and a sixth NMOS transistor having a drain connected to a connection node between the sources of the fourth and fifth NMOS transistors, a gate connected to a second bias voltage terminal, and a source connected to a ground.

The broadband active circuit may further include: a buffer amplifying unit connected to the output terminal of the active circuit unit.

The buffer amplifying unit may include: a seventh NMOS transistor having a drain connected to the power source voltage terminal, a gate connected to the first output terminal, and a source connected to a first final output terminal; an eighth NMOS transistor having a drain connected to the power source voltage terminal, a gate connected to the second output terminal, and a source connected to a second final output terminal; a ninth NMOS transistor having a drain connected to the first final output terminal, a gate connected to the second bias voltage terminal, a source connected to a ground; and a tenth NMOS transistor having a drain connected to the second final output terminal, a gate connected to the second bias voltage terminal, and a source connected to a ground.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

Figure 1:
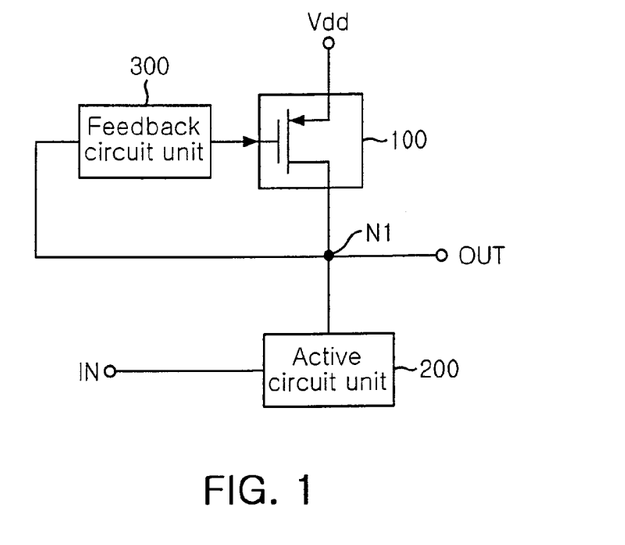
FIG. 1 is a schematic block diagram of a broadband active circuit with a feedback structure according to an exemplary embodiment of the present invention.

FIG. 1 is a schematic block diagram of a broadband active circuit with a feedback structure according to an exemplary embodiment of the present invention.

With reference to FIG. 1, a broadband active circuit with a feedback structure according to an exemplary embodiment of the present invention includes an active load unit 100 providing a load varied according to a control voltage Vc, an active circuit unit 200 connected between the active load unit 100 and a ground and outputting a signal corresponding to a pre-set bandwidth, among input signals, and a feedback circuit unit 300 formed between an output terminal OUT of the active circuit unit 200 and the active load unit 100 and providing a signal from the output terminal OUT of the active circuit unit 200 to the active load unit 100.

The broadband active circuit according to an exemplary embodiment of the present invention may have various structures, some of which will now be described.

Figure 2A:
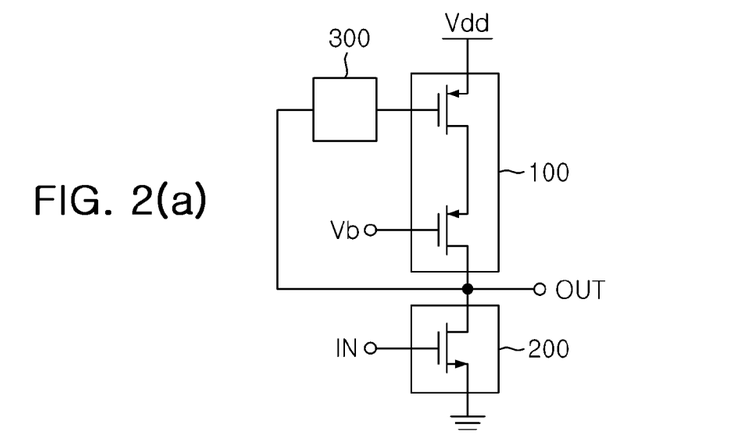
FIGS. 2(a), 2(b), and 2(c) illustrate feedback structures according to exemplary embodiments of the present invention.
Figure 2B:
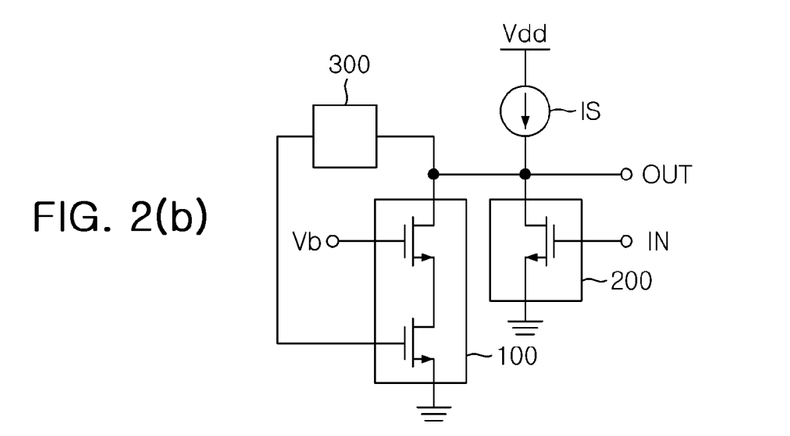
Figure 2C:
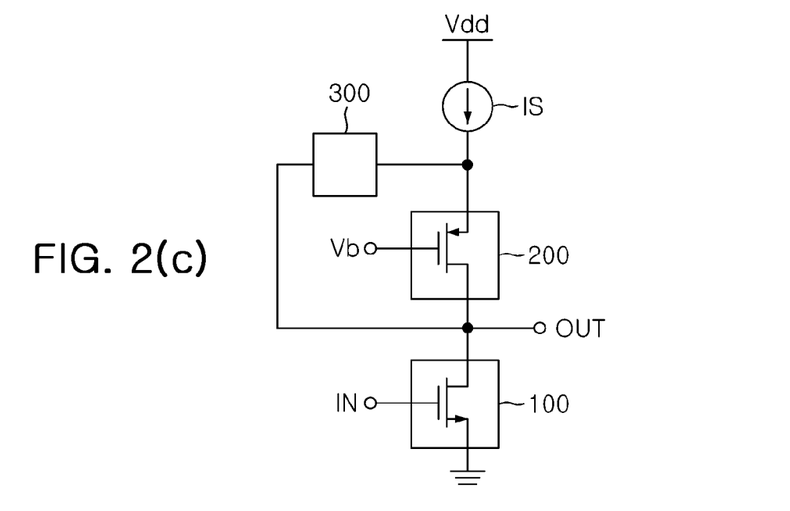

FIGS. 2(a), 2(b), and 2(c) illustrate feedback structures according to an exemplary embodiment of the present invention. With reference to FIG. 2(a), the active load unit 100 may have a cascade structure in which a PMOS transistor is stacked between a power source voltage terminal Vdd and the output terminal OUT, and provide a load varied according to the control voltage Vc.

With reference to FIG. 2(b), the active load unit 100 may have a cascade structure in which an NMOS transistor is stacked between a ground terminal and the output terminal OUT, provide a load varied according to the control voltage Vc, and further include a current source connected between the power source voltage Vdd and the output terminal OUT.

With reference to FIG. 2(c), the active load unit 100 includes at least one MOS transistor, and the feedback circuit unit 300 has an input terminal connected to the output terminal OUT of the active load unit 100 and an output terminal connected to a source of the MOS transistor of the active load unit 100.

Alternatively, the active load unit 100 may include at least one MOS transistor, and the feedback circuit unit 300 has an input terminal connected to the output terminal OUT of the active load unit 100 and an output terminal connected to a gate of the MOS transistor of the active load unit 100.

In the broadband active circuit according to an exemplary embodiment of the present invention, the feedback circuit unit 300 may be implemented as various circuits, some of which will now be described.

Figure 3A:
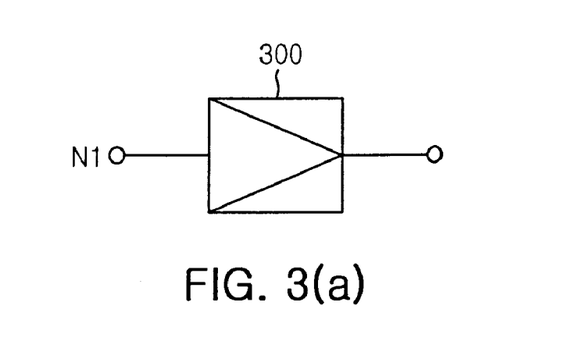
FIGS. 3(a), 3(b), and 3(c) illustrate implemented feedback circuit units according to an exemplary embodiment of the present invention.
Figure 3B:
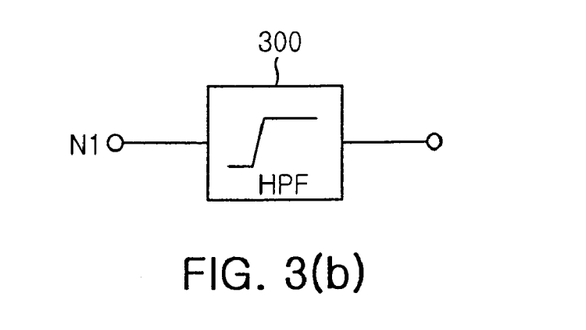
Figure 3C:
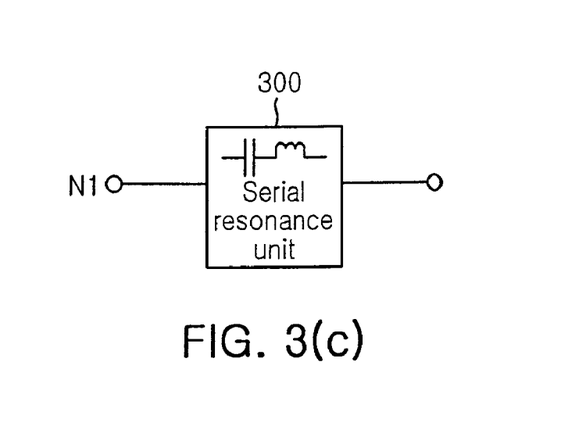

FIGS. 3(a), 3(b), and 3(c) illustrate implemented feedback circuit units according to an exemplary embodiment of the present invention. With reference to FIG. 3(a), the feedback circuit unit 300 may be configured as an amplifier amplifying a signal from the output terminal OUT according to a pre-set gain.

With reference to FIG. 3(b), the feedback circuit unit 300 may be configured as a high pass filter (HPF) allowing a pre-set high pass signal, among signals from the output terminal OUT, to pass therethrough.

With reference to FIG. 3(c), the feedback circuit unit 300 may be configured as a serial resonance circuit transferring a pre-set frequency signal among signals from the output terminal OUT.

Figure 4:
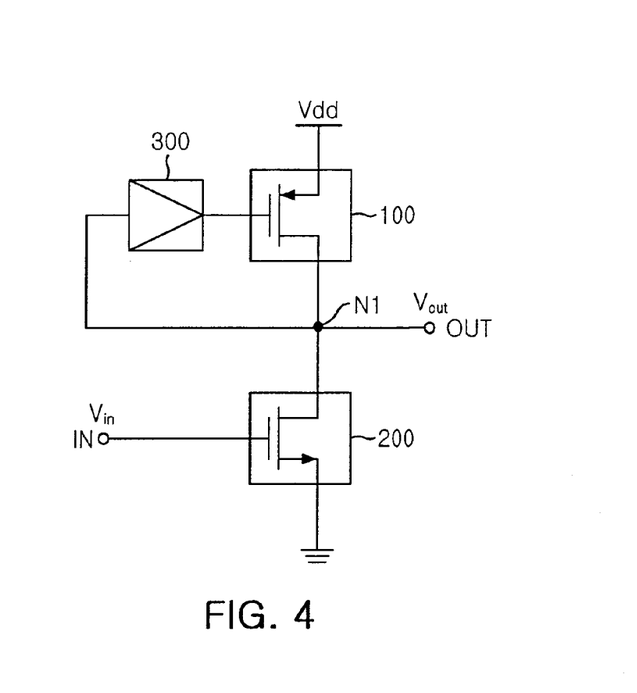
FIG. 4 is a circuit diagram of a broadband active circuit with a feedback structure according to an exemplary embodiment of the present invention.

FIG. 4 is a circuit diagram of a broadband active circuit with a feedback structure according to an exemplary embodiment of the present invention. With reference to FIG. 4, the broadband active circuit with a feedback structure according to an exemplary embodiment of the present invention includes an active load unit 100 connected to a power source voltage terminal Vdd and providing a load varied according to a control voltage Vc, an active circuit unit 200 connected between the active load unit 100 and a ground and outputting a signal corresponding to a pre-set bandwidth, among input signals, and a feedback circuit unit 300 formed between an output terminal OUT of the active circuit unit 200 and the active load unit 100 and amplifying a signal from the output terminal OUT of the active circuit unit 200 to provide the control voltage Vc to the active load unit 100.

The broadband active circuit as illustrated in FIG. 4 according to an exemplary embodiment of the present invention also may have various feedback structures as illustrated in FIGS. 2(a), 2(b), and 2(c).

Figure 5:
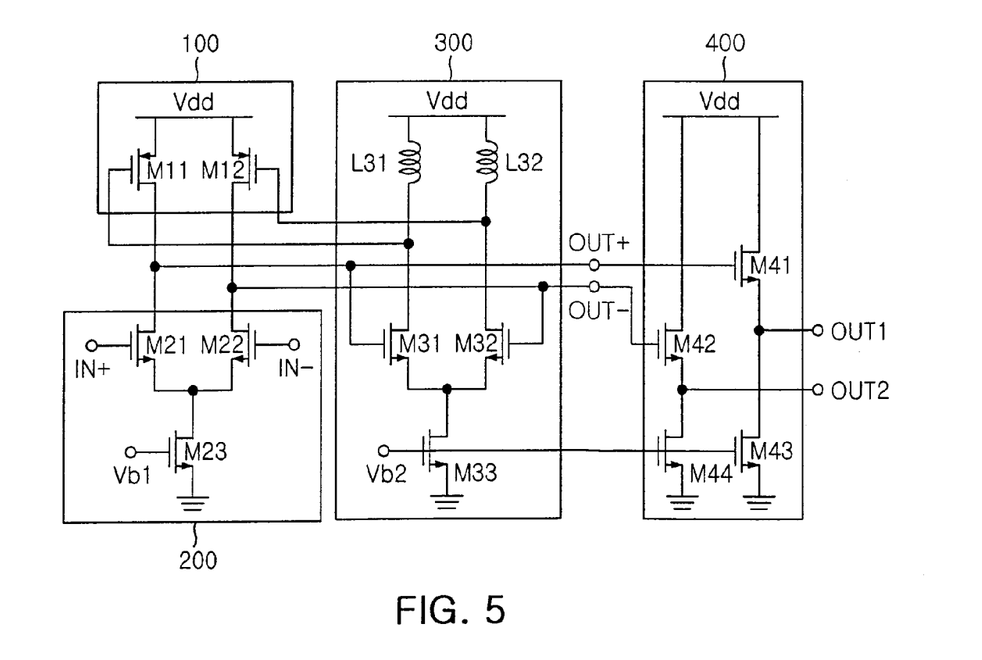
FIG. 5 is a detailed circuit diagram of the broadband active circuit with a feedback structure according to an exemplary embodiment of the present invention.

FIG. 5 is a detailed circuit diagram of the broadband active circuit with a feedback structure according to an exemplary embodiment of the present invention.

With reference to FIG. 5, the active load unit 100 includes a first PMOS transistor M11 having a source connected to the power source voltage terminal Vdd, a gate receiving a first control voltage Vc1 among the control voltage Vc, and a drain connected to a first output terminal OUT+ among the output terminal OUT, and a second PMOS transistor M12 having a source connected with the power source voltage terminal Vdd, a gate receiving a second control voltage Vc2 among the control voltage Vc, and a drain connected to a second output terminal OUT− among the output terminal OUT.

Also, the active load unit 200 may include a first NMOS transistor M21 having a drain connected to the first output terminal OUT+, a gate connected to a first input terminal IN+, and a source, a second NMOS transistor M22 having a drain connected to the second output terminal OUT−, a gate connected to a second output terminal IN−, and a source, and a third NMOS transistor M23 having a drain connected to a connection node between the sources of the first and second NMOS transistors M21 and M22, a gate connected to a first bias voltage terminal Vb1, and a source connected to a ground.

The feedback circuit unit 300 includes a first inductor L31 having one end connected to the power source voltage terminal Vdd, a second inductor L32 having one end connected to the power source voltage terminal Vdd, a fourth NMOS transistor M31 having a drain connected to the other end of the first inductor L31, a gate connected to the first output terminal OUT+, and a source, a fifth NMOS transistor M32 having a drain connected to the other end of the second inductor L32, a gate connected to the second output terminal OUT−, and a source, and a sixth NMOS transistor M33 having a drain connected to a connection node between the sources of the fourth and fifth NMOS transistors M31 and M32, a gate connected to a second bias voltage terminal Vb2, and a source connected to a ground.

The broadband active circuit having the feedback structure may further include a buffer amplifying unit 400 connected to an output terminal of the active circuit unit 200.

The buffer amplifying unit 400 includes a seventh NMOS transistor M41 having a drain connected to the power source voltage terminal Vdd, a gate connected to the first output terminal OUT+, and a source connected to a first final output terminal OUT1, an eighth NMOS transistor M42 having a drain connected to the power source voltage terminal Vdd, a gate connected to the second output terminal OUT−, and a source connected to a second final output terminal OUT2, a ninth NMOS transistor M43 having a drain connected to the first final output terminal OUT1, a gate connected to the second bias voltage terminal Vb2, and a source connected to a ground, and a tenth NMOS transistor M44 having a drain connected to the second final output terminal OUT2, a gate connected to the second bias voltage terminal Vb2, and a source connected to a ground.

Figure 6:
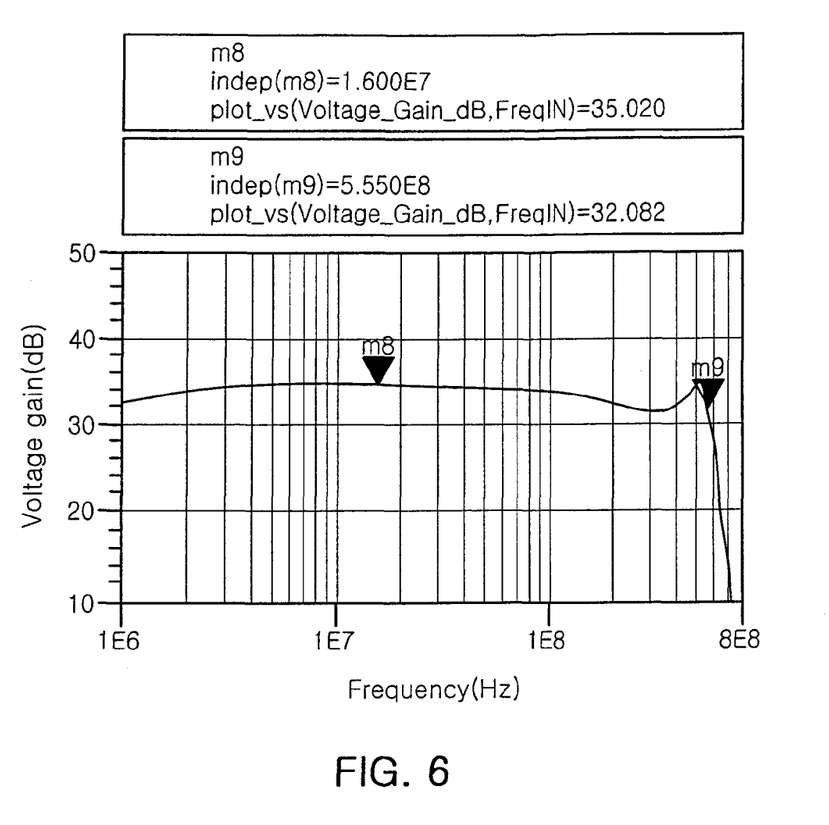
FIG. 6 is a graph showing the frequency characteristics of the broadband active circuit according to an exemplary embodiment of the present invention.

FIG. 6 is a graph showing the frequency characteristics of the broadband active circuit according to an exemplary embodiment of the present invention, in which m8 indicates the gain at a frequency band of 160 MHz and m9 indicates the gain at a frequency band of 555 MHz at a right portion.

The broadband active circuit with a feedback structure according to an exemplary embodiment of the present invention will now be described with reference to FIGS. 1 to 6. With reference to FIG. 1, the broadband active circuit may include the active load unit 100, the active circuit unit 200, and the feedback circuit unit 300.

In this case, the active load unit 100 provides a load varied according to the control voltage Vc. Here, the control voltage Vc may be a voltage provided from the feedback circuit unit 300, or may be a pre-set base voltage.

The active circuit unit 200 is connected between the active load unit 100 and a ground and outputs a signal corresponding to a pre-set bandwidth, among input signals.

The feedback circuit unit 300 is formed between the output terminal OUT of the active circuit unit 200 and the active load unit 100 and provides a signal from the output terminal OUT of the active circuit unit 200 to the active load unit 100.

The bandwidth can be improved by the feedback circuit unit 300, which will be described later.

Meanwhile, the broadband active circuit according to an exemplary embodiment of the present invention may have various feedback structures as shown in FIGS. 2(a), 2(b), and 2(c), and the feedback circuit unit 300 may be implemented as various circuits.

The case in which the feedback circuit unit 300 is configured as an amplifier in the broadband active circuit according to an exemplary embodiment of present invention will now be described with reference to FIGS. 4 to 6.

As shown in FIG. 4, the broadband active circuit according to an exemplary embodiment of the present invention includes the active load unit 100, the active circuit unit 200, and the feedback circuit unit 300 configured as an amplifier.

In this case, the active load unit 100 is connected to the power source voltage terminal Vdd and provides a load varied according to the control voltage Vc transferred from the feedback circuit unit 300.

The active circuit unit 200 is connected between the active load unit 100 and the ground, and amplifies a signal corresponding to a pre-set bandwidth, among input signals, and outputs the amplified signal through the output terminal OUT.

The amplifier of the feedback circuit unit 300 is formed between the output terminal OUT of the active circuit unit 200 and the active load unit 100, and amplifies a signal transferred from the output terminal OUT of the active circuit unit 200 to output the control voltage Vc to the active load unit 100.

The broadband active circuit according to an exemplary embodiment of the present invention will now be described with reference to FIG. 5.

With reference to FIG. 5, the active load unit 100 includes the first and second PMOS transistors M11 and M12, and the internal resistance of the first and second PMOS transistors M11 and M12 is varied according to the first and second control voltages Vc1 and Vc2, and as a result, the active load unit 100 provides a load according to the first and second control voltages Vc1 and Vc2.

The active circuit unit 200 includes the first, second, and third NMOS transistors M21, M22, and M23. The first and second NMOS transistors M21 and M22 amplify signals received through the first and second input terminals IN+ and IN− and output the amplified signals through the first and second output terminals OUT+ and OUT−. In this case, the third NMOS transistor M23 makes a certain operational current flow across the first and second NMOS transistors M21 and M22.

The feedback circuit unit 300 includes the first and second inductors L31 and L32 and the fourth, fifth, and sixth NMOS transistors M31, M32, and M33. The first and second inductors L31 and L32 provide a load. The fourth and fifth NMOS transistors M31 and M32 amplify signals received through the first and second output terminals OUT+ and OUT− of the active circuit unit 200, and supplies the amplified signals as the first and second control voltages Vc1 and Vc2 to the respective gates of the first and second PMOS transistors M11 and M12 of the active load unit 100.

The broadband active circuit with the feedback structure may further include the buffer amplifying unit 400 connected to the output terminal of the active circuit unit 200.

The buffer amplifying unit 400 includes the seventh, eighth, ninth, and tenth NMOS transistors M41, M42, M43, and M44. The seventh and eighth NMOS transistors M41 and M42 are implemented as source follower amplifies and output a signal transferred from the active circuit unit 200 through the first and second final output terminals OUT1 and OUT2.

The ninth and tenth NMOS transistors M43 and M44 make a certain current flow across the seventh and eighth NMOS transistors M41 and M42.

As for the bandwidth with respect to the active circuit unit 200 according to an exemplary embodiment of the present invention illustrated in FIG. 5, a transfer function of the active circuit unit 200 illustrated in FIG. 5 can be represented by Equation 1 shown below:

$$Av(\omega) = -\frac{g_m(R_o // Z_{Co})}{1 + A_o g_{mp}(R_o // Z_{Co})} \quad \text{[Equation 1]}$$
$$= -\frac{g_m R_o}{1 - j\omega C_o R_o - j\omega g_{m3} L g_{mp} R_o}$$

Here, $g_m$ is a trans-conductance of one of the first and second NMOS transistors M21 and M22 having the same characteristics within the active circuit unit 200, $R_o$ is an output resistance of the active circuit unit 200, $Z_{Co}$ is an output capacitance of the active circuit unit 200, $A_o$ is a voltage gain of the feedback circuit unit 300, and $g_{mp}$ is a trans-conductance of one of the first and second PMOS transistors M11 and M12 having the same characteristics within the active load unit. $g_{m3}$ is a trans-conductance of one of the fourth and fifth NMOS transistors M31 and M32 having the same characteristics within the feedback circuit unit 300.

If the condition that the denominator of Equation 1 (namely, $C_o R_o = g_{m3} L g_{mp} R_o$) is met, Equation 1 can be simply represented by Equation 2 shown below:

$$Av(\omega) = -\frac{g_m R_o}{1} \quad \text{[Equation 2]}$$

As noted in Equation 2, the transfer function is determined irrespective of frequency in the active circuit unit 200, so the active circuit unit 200 can perform broadband amplifying regardless of frequency.

With reference to FIG. 6, referring to the gain (m8) at the frequency band of 160 MHz and the gain (m9) at the frequency band of 555 MHz at the right portion, it is noted that the sufficient gain can be obtained at the frequency band of 555 MHz even at the right portion.

As described above, the gain can be increased by dynamically changing the resistance value of the load transistor by using an output signal, and in this case, the additional installation of the amplifier obtaining a high gain of high frequency component improves the bandwidth of the circuit.

As set forth above, according to exemplary embodiments of the invention, a bandwidth can be improved by forming a feedback structure to feed back a signal from an output terminal of an active circuit such as an amplifier, a mixer, and the like, to an active load.

While the present invention has been shown and described in connection with the exemplary embodiments, it will be apparent to those skilled in the art that modifications and variations can be made without departing from the spirit and scope of the invention as defined by the appended claims.

What is claimed is:

1. A broadband active circuit with a feedback structure, the active circuit comprising:
   an active load unit providing a load varied according to control voltages;
   an active circuit unit connected between the active load unit and a ground and outputting a signal corresponding to a pre-set bandwidth, among input signals; and
   a feedback circuit unit formed between output terminals of the active circuit unit and the active load unit and providing signals from the output terminals of the active circuit unit to the active load unit,
   wherein the active load unit comprises:
      a first PMOS transistor having a source connected to a power voltage terminal, a gate receiving a first control voltage among the control voltages, and a drain connected to a first output terminal among the output terminals; and
      a second PMOS transistor having a source connected to the power voltage terminal, a gate receiving a second control voltage among the control voltages, and a drain connected to a second output terminal among the output terminals,
   wherein the active circuit unit comprises:
      a first NMOS transistor having a drain connected to the first output terminal, a source, and a gate connected to a first input terminal;
      a second NMOS transistor having a drain connected to the second output terminal, a source, and a gate connected to a second input terminal; and
      a third NMOS transistor having a drain connected to a connection node between the sources of the first and second NMOS transistors, a gate connected to a first bias voltage terminal, and a source connected to the ground,
   wherein the feedback circuit unit comprises:
      a first inductor having one end connected to the power voltage terminal;
      a second inductor having one end connected to the power voltage terminal;
      a fourth NMOS transistor having a drain connected to the other end of the first inductor, a source, and a gate connected to the first output terminal;
      a fifth NMOS transistor having a drain connected to the other end of the second inductor, a source, and a gate connected to the second output terminal; and a sixth NMOS transistor having a drain connected to a connection node between the sources of the fourth and fifth NMOS transistors, a gate connected to a second bias voltage terminal, and a source connected to the ground.

2. The active circuit of claim 1, wherein the active load unit has a cascade structure between the power voltage terminal and the output terminals and provide a load varied according to the control voltages.

3. The active circuit of claim 1, wherein the active load unit has a cascade structure between a ground terminal and an output terminal and provides a load varied according to the control voltage, and further comprises a current source connected between the power voltage terminal and the output terminal.

4. The active circuit of claim 2, wherein the active load unit comprises at least one MOS transistor, and the feedback circuit unit comprises an input terminal connected to the output terminal of the active load unit and an output terminal connected to a gate of the MOS transistor of the active load unit.

5. The active circuit of claim 2, wherein the active load unit comprises at least one MOS transistor, and the feedback circuit unit comprises an input terminal connected to the output terminal of the active load unit and an output terminal connected to a source of the MOS transistor of the active load unit.

6. The active circuit of claim 3, wherein the active load unit comprises at least one MOS transistor, and the feedback circuit unit comprises an input terminal connected to the output terminal of the active load unit and an output terminal connected to a gate of the MOS transistor of the active load unit.

7. The active circuit of claim 3, wherein the active load unit comprises at least one MOS transistor, and the feedback circuit unit comprises an input terminal connected to the output terminal of the active load unit and an output terminal connected to a source of the MOS transistor of the active load unit.

8. The active circuit of claim 1, wherein the feedback circuit unit is one selected from among an amplifier, a high pass filter (HPF), and a serial resonance circuit.

9. A broadband active circuit with a feedback structure, the circuit comprising:
an active load unit connected to a power voltage terminal and providing a load varied according to control voltages;
an active circuit unit connected between the active load unit and a ground and outputting a signal corresponding to a pre-set bandwidth, among input signals; and
a feedback circuit unit configured as an amplifier formed between output terminals of the active circuit unit and the active load unit and amplifying a signal from the output terminals of the active circuit unit to provide the control voltages to the active load unit,
wherein the active load unit comprises:
a first PMOS transistor having a source connected to the power voltage terminal, a gate receiving a first control voltage among the control voltages, and a drain connected to a first output terminal among the output terminals; and
a second PMOS transistor having a source connected to the power voltage terminal, a gate receiving a second control voltage among the control voltages, and a drain connected to a second output terminal among the output terminals,
wherein the active circuit unit comprises:
a first NMOS transistor having a drain connected to the first output terminal, a source, and a gate connected to a first input terminal;
a second NMOS transistor having a drain connected to the second output terminal, a source, and a gate connected to a second input terminal; and
a third NMOS transistor having a drain connected to a connection node between the sources of the first and second NMOS transistors, a gate connected to a first bias voltage terminal, and a source connected to the ground,
wherein the feedback circuit unit comprises:
a first inductor having one end connected to the power voltage terminal;
a second inductor having one end connected to the power voltage terminal;
a fourth NMOS transistor having a drain connected to the other end of the first inductor, a source, and a gate connected to the first output terminal;
a fifth NMOS transistor having a drain connected to the other end of the second inductor, a source, and a gate connected to the second output terminal; and
a sixth NMOS transistor having a drain connected to a connection node between the sources of the fourth and fifth NMOS transistors, a gate connected to a second bias voltage terminal, and a source connected to the ground.

10. The active circuit of claim 9, wherein the active load unit has a cascade structure between the power voltage terminal and output terminals, and provides a load varied according to the control voltages.

11. The active circuit of claim 9, wherein the active load unit has a cascade structure between a ground terminal and an output terminal and provides a load varied according to the control voltage, and further comprises a current source connected between the power voltage terminal and the output terminal.

12. The active circuit of claim 10, wherein the active load unit comprises at least one MOS transistor, and the feedback circuit unit comprises an input terminal connected to the output terminal of the active load unit and an output terminal connected to a gate of the MOS transistor of the active load unit.

13. The active circuit of claim 10, wherein the active load unit comprises at least one MOS transistor, and the feedback circuit unit comprises an input terminal connected to the output terminal of the active load unit and an output terminal connected to a source of the MOS transistor of the active load unit.

14. The active circuit of claim 11, wherein the active load unit comprises at least one MOS transistor, and the feedback circuit unit comprises an input terminal connected to the output terminal of the active load unit and an output terminal connected to a gate of the MOS transistor of the active load unit.

15. The active circuit of claim 11, wherein the active load unit comprises at least one MOS transistor, and the feedback circuit unit comprises an input terminal connected to the output terminal of the active load unit and an output terminal connected to a source of the MOS transistor of the active load unit.

16. The active circuit of claim 9, wherein the active circuit unit is an amplifier connected between the active load unit and the ground and amplifying the signal corresponding to the pre-set bandwidth, among input signals, by a pre-set gain.

17. The active circuit of claim 9, further comprising:
a buffer amplifying unit connected to the output terminal of the active circuit unit.

18. The active circuit of claim 17, wherein the buffer amplifying unit comprises:
a seventh NMOS transistor having a drain connected to the power source voltage terminal, a gate connected to the first output terminal, and a source connected to a first final output terminal;
an eighth NMOS transistor having a drain connected to the power source voltage terminal, a gate connected to the second output terminal, and a source connected to a second final output terminal;
a ninth NMOS transistor having a drain connected to the first final output terminal, a gate connected to the second bias voltage terminal, and a source connected to a ground; and
a tenth NMOS transistor having a drain connected to the second final output terminal, a gate connected to the second bias voltage terminal, and a source connected to a ground.

19. A broadband active circuit with a feedback structure, the circuit comprising:
an active load unit connected to a power voltage terminal and providing a load varied according to control voltages;
an active circuit unit connected between the active load unit and a ground and outputting a signal corresponding to a pre-set bandwidth, among input signals, the active circuit unit being an amplifier connected between the active load unit and the ground and amplifying the signal corresponding to the pre-set bandwidth, among input signals, by a pre-set gain; and
a feedback circuit unit configured as an amplifier formed between output terminals of the active circuit unit and the active load unit and amplifying a signal from the output terminals of the active circuit unit to provide the control voltages to the active load unit,
wherein the active load unit comprises:
a first PMOS transistor having a source connected to the power voltage terminal, a gate receiving a first control voltage among the control voltages, and a drain connected to a first output terminal among the output terminals; and
a second PMOS transistor having a source connected to the power voltage terminal, a gate receiving a second control voltage among the control voltages, and a drain connected to a second output terminal among the output terminals, wherein the active circuit unit comprises:
a first NMOS transistor having a drain connected to the first output terminal, a source, and a gate connected to a first input terminal;
a second NMOS transistor having a drain connected to the second output terminal, a source, and a gate connected to a second input terminal; and
a third NMOS transistor having a drain connected to a connection node between the sources of the first and second NMOS transistors, a gate connected to a first bias voltage terminal, and a source connected to the ground,
wherein the feedback circuit unit comprises:
a first inductor having one end connected to the power voltage terminal;
a second inductor having one end connected to the power voltage terminal;
a fourth NMOS transistor having a drain connected to the other end of the first inductor, a source, and a gate connected to the first output terminal;
a fifth NMOS transistor having a drain connected to the other end of the second inductor, a source, and a gate connected to the second output terminal; and
a sixth NMOS transistor having a drain connected to a connection node between the sources of the fourth and fifth NMOS transistors, a gate connected to a second bias voltage terminal, and a source connected to the ground.

20. The active circuit of claim 19, further comprising:
a buffer amplifying unit connected to the output terminal of the active circuit unit.

21. The active circuit of claim 20, wherein the buffer amplifying unit comprises:
a seventh NMOS transistor having a drain connected to the power source voltage terminal, a gate connected to the first output terminal, and a source connected to a first final output terminal;
an eighth NMOS transistor having a drain connected to the power source voltage terminal, a gate connected to the second output terminal, and a source connected to a second final output terminal;
a ninth NMOS transistor having a drain connected to the first final output terminal, a gate connected to the second bias voltage terminal, and a source connected to a ground; and
a tenth NMOS transistor having a drain connected to the second final output terminal, a gate connected to the second bias voltage terminal, and a source connected to a ground.

* * * * *